US006772182B1

(12) United States Patent
McDonald et al.

(10) Patent No.: US 6,772,182 B1
(45) Date of Patent: Aug. 3, 2004

(54) SIGNAL PROCESSING METHOD FOR IMPROVING THE SIGNAL-TO-NOISE RATIO OF A NOISE-DOMINATED CHANNEL AND A MATCHED-PHASE NOISE FILTER FOR IMPLEMENTING THE SAME

(75) Inventors: B. Edward McDonald, Annandale, VA (US); Gregory J. Orris, Washington, DC (US); William A. Kuperman, LaJolla, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 08/757,173

(22) Filed: Nov. 27, 1996

Related U.S. Application Data

(60) Provisional application No. 60/008,410, filed on Dec. 8, 1995.

(51) Int. Cl.[7] .............................................. G06F 17/10

(52) U.S. Cl. ...................................... 708/321; 708/314

(58) Field of Search ....................... 364/724.18, 724.11, 364/724.011, 724.013; 708/321, 314, 300, 303

(56) References Cited

U.S. PATENT DOCUMENTS

| | | | |
|---|---|---|---|
| 3,683,325 A | | 8/1972 | Vlahos ................... 343/17.2 R |
| 4,769,847 A | | 9/1988 | Taguchi ....................... 381/94 |
| 4,882,668 A | * | 11/1989 | Schmid et al. ......... 364/724.11 |
| 5,097,510 A | | 3/1992 | Graupe ........................ 381/47 |
| 5,319,736 A | | 6/1994 | Hunt ......................... 395/2.36 |
| 5,539,859 A | | 7/1996 | Robbe et al. .............. 395/2.42 |
| 5,612,978 A | * | 3/1997 | Blanchard et al. .... 364/724.011 |
| 5,721,694 A | * | 2/1998 | Graupe ................ 364/724.011 |

OTHER PUBLICATIONS

Abstract of G.J. Orris et al, Phase–Matching Filter Techniques for Low Signal–To–Noise Data, 91 J. Acoust. Soc. Am. 2444 (No. 4, pt. 2, Apr., 1992).
Abstract of G. Orris et al., Developments in Phase–Matching Filter Techniques, 92 J. Acoust. Soc. Am. 2418 (No. 4, Pt. 2, Oct., 1992).
B.E. McDonald et al., Applications of Matched–Phase Noise Reduction to Wind–Wave Generated Noise, Proceedings of the III International Meeting on Natural Physical Processes Related to Sea Surface Sound, at p. 20 (Conference Mar. 7–11, 1994).
T.G. Birdsall et al., Signals, Signal Processing, and General Results, 96 J. Acoust. Soc. Am. 2342 (No. 4, Oct., 1994).
G.J. Orris et al., Matched–Phase Noise Reduction, 96 J. Acoust. Soc. Am. 3499 (No. 6, Dec., 1994) .
B.E. McDonald et al., Performance of the Matched–Phase Noise Filter with Estimated Noise Spectra, 122 J. of Computational Physics 185 (1995).

* cited by examiner

*Primary Examiner*—David H. Malzahn
(74) *Attorney, Agent, or Firm*—John J. Karasek; John Gladstone Mills, III

(57) ABSTRACT

A matched-phase noise filter includes an analog to digital converter (ADC) for receiving an analog composite, noise-dominated signal containing a signal of interest and producing a digital composite signal, an input/output port receiving the digital composite signal and providing a matched-phase signal, and a processor receiving the digital composite signal via the I/O port and generating the matched-phase signal. According to one aspect of the invention, the signal to noise ratio between the signal of interest and a noise component within the digital composite signal is increased by approximately an order of magnitude, based on an actual spectrum of the digital composite signal and an estimated spectrum of the noise component, and independent of the particular form of the signal of interest. A method of matched-phase noise filtering for improving the SNR of a noise dominated signal independent of the form of the signal is also described.

14 Claims, 3 Drawing Sheets

BEST AVAILABLE COPY

SIGNAL PROCESSING METHOD FOR IMPROVING THE SIGNAL-TO-NOISE RATIO OF A NOISE-DOMINATED CHANNEL AND A MATCHED-PHASE NOISE FILTER FOR IMPLEMENTING THE SAME

This application has the priority of Provisional Application 60/008,410, filed Dec. 8, 1995.

BACKGROUND OF THE INVENTION

The present invention relates generally to noise filters, and more particularly, to a matched-phase noise filter and associated method which enables a signal which is extremely weak relative to associated noise to be extracted from an extremely noisy channel.

Presently available methods for enhancing the signal-to-noise ratio (SNR) of a noisy recording include, in increasing order of sophistication, bandpass filtering, optimal filtering, averaging, and noise subtraction. Bandpass filtering is effective when the signal and the noise are known to occupy different portions of the frequency spectrum, with the pass band(s) being set to allow passage of the signal and to reject the noise. Optimal filtering (which is a generalization of bandpass filtering) is effective to improve the SNR when the frequency spectrum of the signal is known, with the shape of the filter frequency curve being set to match that of the original spectrum. With the averaging approach, many recordings of the same signal received at different times are averaged. Presumably, the noise in the overlaid recordings is canceled by the mechanism of destructive interference, while the signal is obtained by the mechanism of constructive interference. With this approach, it is necessary to accurately detect a timing mark within the signal time series in order to obtain constructive signal interference among the different recordings. The signal processing gain for this approach is equal to the number of independent recordings averaged. The noise subtraction approach can be utilized when a precise recording of the noise field is made simultaneously with the reception and recording of the noisy signal. With this approach, the noise time series is subtracted from the recording containing the noisy signal to thereby yield a "clean" signal with the noise removed therefrom. An illustrative example of a device which employs this technique in the field of law enforcement works in the below-described manner. First, a conversation between criminal suspects is deliberately obscured by increasing the volume on a nearby radio or television, and law enforcement personnel recording the obscured conversation simultaneously make a "clean" recording of the same radio or television program at another location. The "clean" recording of the "noise" signal (i.e., the recorded radio or television program) is later subtracted from a recording of the obscured conversation, thereby yielding a "clean" signal which can be made to reveal the content of the conversation.

Although the first three noise filtering techniques are adequate for many applications, they each attempt to recover a signal from a noisy background by recognizing features of the signal (i.e., by its expected time signature or spectral domain), and thus, in addition to other limitations and shortcomings, are ineffective when no a prior information about the received signal is available. The final technique, in contrast, becomes ineffective unless a pure recording of the "noise" is available at precisely the time of interest.

In the past, attempts were made to suppress noise in cases in which the strength of the signal is extremely weak relative to that of the noise by utilization of such array processing techniques as matched-field processing and beam forming, which typically exploit the spatial structure of the acoustic field through multiple sensors to effect a gain. Thus, these array processing techniques are also ineffective in systems in which a single phone or sensor, whether moving or stationary, is available. Furthermore, the presently available signal processing techniques do not make full use of all that is known about a background noise field in order to improve the SNRs. For example, the Heard Island Feasibility Test disclosed in an article entitled "The Heard Island Feasibility Test", *J. Acoust. Soc. Am.* 96, 2343–2352 (1994), averaged many receptions of a repeatedly transmitted sequence as part of a "pulse compression" strategy in order to improve SNR. This strategy relies on being able to align receptions of carefully coded signal segments before averaging them together, achieving gain by virtue of the vanishing long-term time average of the noise field. No attempt was made to "recognize" the noise field by its spectral profile, and thus use the knowledge of what noise "sounds like" in order to reject it.

Based on the above, it can be appreciated that there presently exists a need in the art for a noise filtering method (and noise filter for implementing the same) which improves signal-to-noise ratios (SNRs) in noise dominated data, utilizing information concerning the shape of the noise spectrum, even in cases of very-low-signal-to-noise-ratio (VLSNR) where no a priori information about the signal is known, and no a priori information about the phase of the noise field is known. The present invention fulfills this need in the art.

SUMMARY OF THE INVENTION

Accordingly, an overall object of the present invention is to improve the signal-to-noise ratio (SNR) of a noise-dominated recording made on a single receiver (as opposed to an array) by removing the majority of the noise, which signal component is recognized by the shape of its power spectrum.

An object according to the present invention is to provide an acoustic filter which permits the use of the known shape of the noise spectrum for purposes of noise rejection without a priori knowledge of the relative phases of the different frequency components of the noise itself. NO a priori knowledge of the signal is required. More specifically, when a signal of interest and noise are completely un-correlated the performance of the present invention is maximized.

Another object according to the present invention is to provide a signal processing algorithm for suppressing noise in cases for which the strength of the signal is extremely weak relative to that of the noise. According to one aspect of the algorithm, unlike many signal processing methods (e.g., matched-field processing, beam forming, or other array processing techniques, which typically exploit the spatial structure of the acoustic field through multiple sensors to effect a gain) the algorithm according to the present invention concentrates on the noise content of a recording from a single phone or sensor whether moving or stationary. Consequently, it offers performance enhancement for work using only a single phone such as single-phone localization, as well as multiple-phone array processing.

Yet another object according to the present invention is to provide a method for extracting more information per sensor by using the physical characteristics of the noise field ascertainable from the collected data. The form of this a priori knowledge could in principle be extended to any measurable quantity, but the algorithm is most effective for those cases where the frequency spectrum of the noise field is known approximately. This is a natural choice, since frequency spectrum measurements and/or models of all types of sources (both discrete and ambient) are quite common in the literature. Furthermore, it has been shown recently, for example, that the shape of the underwater noise spectrum from wave breaking may be estimated from properties of the observable ocean surface wave field, thus offering the possibility of incorporating knowledge about the noise spectrum implicitly derived from observations unrelated to direct acoustic measurements.

The method according to the present invention enhances signal detection in cases of very-low-signal-to-noise ration (VLSNR) when the shape of the noise spectrum is known, but all relative phase information of individual frequency components is unknown. The method also has the advantage of being easy to implement.

Many contemporary signal processing strategies do not make full use of all that is known about a background noise field in order to improve SNRs. For example, no attempt is made to "recognize" the noise field by its spectral profile, and thus use the knowledge of what noise "sounds like" in order to reject it.

Other approaches from simple bandpass filters to more sophisticated optimal filters attempt to recover a signal from a noisy background by recognizing features of the signal (i.e., by its expected time signature or spectral domain). In contrast, the method according to the present invention advantageously uses unknown phases of the noise field plus a single amplitude coefficient to construct a realization of the noise which, when subtracted from the given time series, best quiets the data.

These and other objects, features and advantages according to the present invention are provided by a matched-phase noise filter including a processor implementing the filter function:

$$\tilde{F}(\omega) = e^{+i\phi(\omega)} \left( |\tilde{P}(\omega)| - \frac{\int d\omega |\tilde{P}(\omega)| |\tilde{N}(\omega)|}{\int d\omega |\tilde{N}(\omega)|^2} |\tilde{N}(\omega)| \right),$$

wherein:

$i = (-1)^{1/2}$;

$\phi(\omega)$ is a set of phases, more particularly a function which varies as a function of frequency;

$\tilde{P}(\omega)$ is the frequency spectrum of a received signal;

$\tilde{N}(\omega)$ is the frequency spectrum of a noise component accompanying the received signal; and $\tilde{F}(\omega)$ is the frequency spectrum of the filtered signal, per the above equation.

Preferably, an embodiment the matched-phase noise filter includes an analog to digital converter (ADC) for receiving an analog composite, noise-dominated signal containing a signal of interest and for producing a digital composite signal, an input/output port receiving the digital composite signal and providing a matched-phase signal, and a processor receiving the digital composite signal via the I/O port and generating the matched-phase signal, wherein a signal to noise ratio between the signal of interest and a noise component within the digital composite signal is increased by approximately an order of magnitude, based on an actual spectrum of the digital composite signal and an estimated spectrum of the noise component and independent of the particular form of the signal of interest.

The present invention also encompasses a method for filtering a noise dominated signal. Preferably, the novel method includes the steps of:

producing an actual spectrum of the noise dominated signal responsive to the noise dominated signal;

selecting an estimated spectrum representing noise in the noise dominated signal; and generating a desired spectrum indicative of a signal of interest based solely on the actual spectrum and the estimated spectrum and, thus, independent of the particular form of the signal of interest.

In accordance with a presently preferred embodiment, the method for filtering a noise dominated signal includes the steps of:

receiving a time series signal consisting mostly of noise and containing a signal of interest;

selecting a close estimate of the frequency dependence of the noise spectrum within the time series signal;

executing a Fast Fourier transform (FFT) of the time series signal so as to obtain spectral amplitudes and phases of each frequency component of the time series signal;

orthogonalizing the input spectral amplitude to the noise spectral amplitude so as to produce orthogonalized spectral amplitudes;

assigning phases to the resultant orthogonalized spectral amplitudes so as to produce assigned phases; and inverse FFT transforming the assigned phases and the orthogonalized spectral amplitudes back into the time domain to thereby produce a matched-phase signal;

wherein a signal to noise ratio (SNR) of the signal of interest with respect to the noise in the matched-phase signal is at least an order of magnitude greater than the SNR of the time series signal.

BRIEF DESCRIPTION OF THE DRAWINGS

These and various other features and aspects of the present invention will be readily understood with reference to the following detailed description taken in conjunction with the accompanying drawings, in which.

DETAILED DESCRIPTION OF THE PREFERRED EMBODIMENTS

The Matched-Phase Noise (MPN) filter is derived from a variational principle which minimizes filter output power with respect to the unknown phases of noise components to be subtracted from an input time series. The spectral amplitude of the noise as a function of frequency is assumed to be known. It will be readily appreciated that the MPN filter is the first noise rejection technique or algorithm to date to exploit the use of known spectral properties of noise fields without requiring phase information. In the field of underwater acoustics, for example, many measurements have been made of ocean noise spectra at various wind conditions and other measurable parameters, e.g., water temperature, salinity, depth, etc. The shape of various ocean noise spectra as a function of frequency from various measurements have similarities which can help to identify and reject ocean noise in recordings where it obscures a signal of interest, e.g., a signal from a submarine, an underwater animal, or an acoustic tomography experiment.

Figure 1:
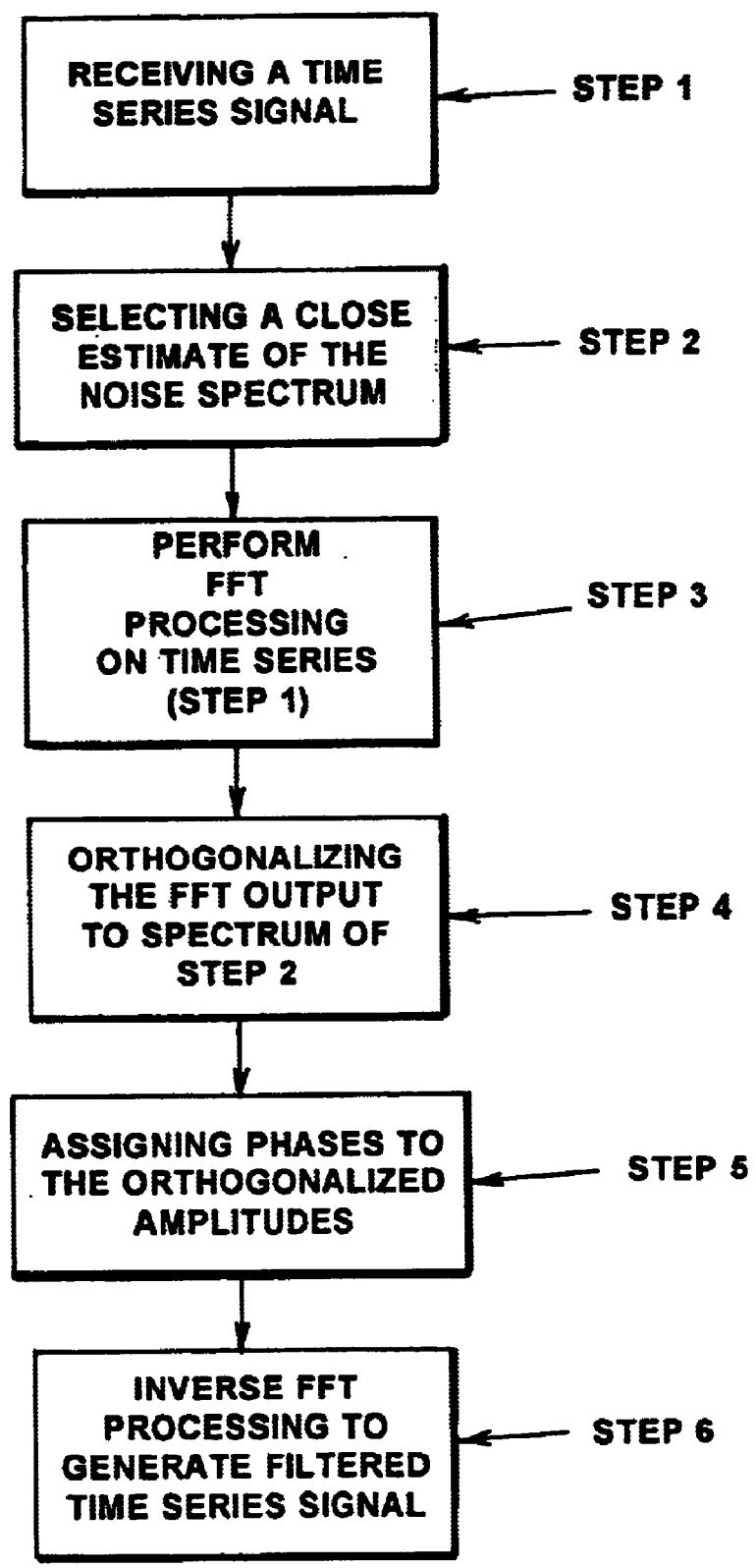
FIG. 1 is a flowchart illustrating the fundamental steps of a matched-phase noise (MPN) according to a preferred embodiment of the present invention.

A first preferred embodiment according to the present invention will now be described with reference to FIG. 1, which is a flowchart depicting essential as well as non-essential steps of the inventive Match-Phase Noise (MPN) filtering method. To implement the MPN filtering method, an input time series consisting mostly of noise is received during step 1 and a good estimate of the frequency dependence of the noise spectrum in the form of an estimated noise spectrum is input during step 2. For reasons discussed in greater detail below, the more accurate the noise estimate, the more sensitive the MPN filtering method becomes. It should be mentioned that the noise does not have to be 'white' corresponding to a constant power spectrum and that absolutely no knowledge of the phases of the noise components is required. Moreover, no knowledge of whatever signal the noise may be obscuring is required. It should also be noted at this juncture that the noise, spectrum need not be obtained in approximately real time but may be obtained from an appropriate data base of noise spectra. Such a data base can advantageously be indexed using a variety of parameters and, preferably, the noise spectra are indexed by wind speed and/or sea state.

During step 3, the MPN filter executes a Fast Fourier Transform (FFT) of the input time series of the signal received during step 1 to obtain amplitudes and phases of each frequency component of the incoming acoustic signal. Preferably, the MPN filter orthogonalizes the input spectral amplitude to the noise spectral amplitude during step 4, assigns the input phases to the result during step 5, and then performs inverse FFT back into the time domain so as to obtain the output time series.

Figure 2:
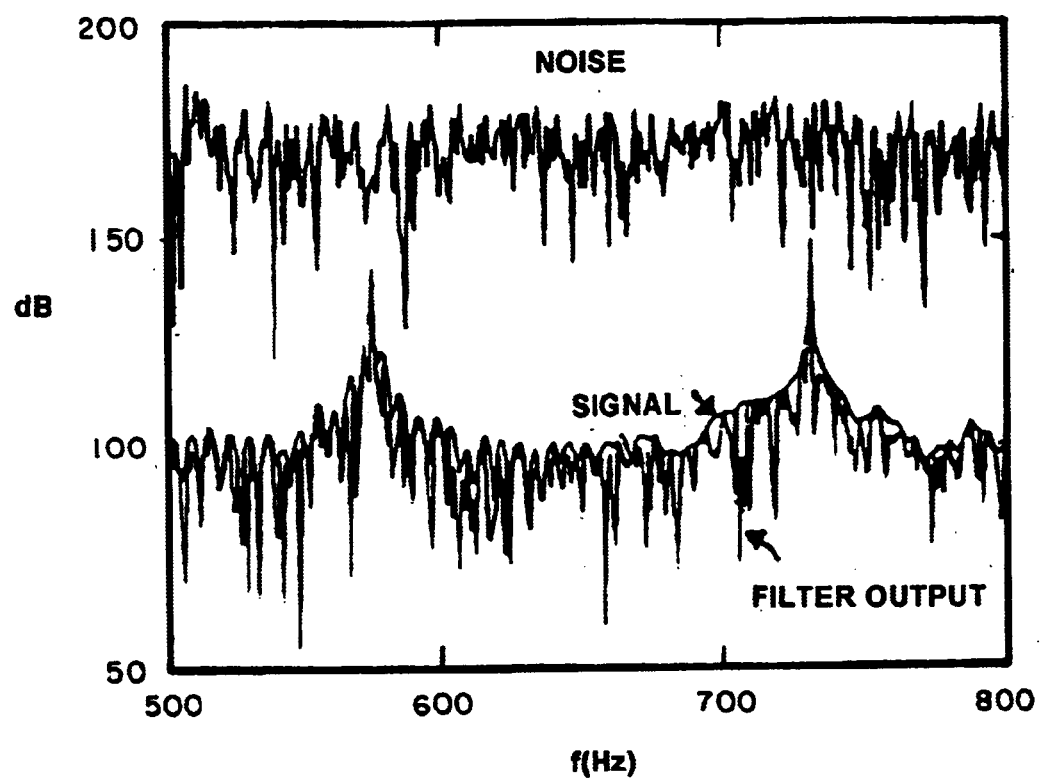
FIG. 2 is a series of waveforms which are useful in explaining the operation of the present invention.

The inventive method according to the first preferred embodiment of the present invention may best be understood by reading the following description of the derivation of the algorithm used in MPN filtering in conjunction with FIG. 2. In an exemplary case, a signal received by a hydrophone has the form P(t)=S(t)+N(t), where S(t) is the signal and N(t) the noise. Fourier transforms of the time domain signals S(t) and N(t) are denoted as $\tilde{S}(\omega), \tilde{N}(\omega)$, so that the expression can be recast as $\tilde{P}(\omega)=\tilde{S}(\omega)+\tilde{N}(\omega)$. It will be appreciated that if a precise measurement of the noise time series could be known a priori, then one could simply subtract N(t) from P(t) and be done, since the difference would be the noiseless signal S(t). This being rather unlikely in most circumstances, consider what can be accomplished if the noise spectrum $|\tilde{N}(\omega)|$ is known for the epoch of interest. Furthermore, the fact that the signal might be intermittent or absent completely in the received signal indicates that any filter that one defines that tries to approximate the signal must not contain any a priori information about the signal. In accordance with the algorithm depicted in FIG. 2, a set of phases $\phi(\omega)$ and an amplitude coefficient $\alpha$ is first constructed and a realization of the noise is subtracted from the recorded data. The filter output is thus defined by the following Equation (1):

$$\tilde{F}(\omega)=\tilde{P}(\omega)-\alpha\exp[i\phi(\omega)]|\tilde{N}(\omega)|, \tag{1}$$

with the free parameters $\alpha$ and the phases $\phi(\omega)$ to be determined by minimizing the integrated power I of the filter output F:

$$\min_{\alpha,\phi(\omega)}[I(F)] = \min_{\alpha,\phi(\omega)}\left(\int d\omega |\tilde{F}(\omega)|^2\right) \tag{2}$$

This leads to the variational equations:

$$\frac{\delta \perp (F)}{\delta \alpha}|_{\phi(\omega)=const} = 0, \tag{3}$$

$$\frac{\delta \perp (F)}{\delta \phi(\omega)}|_{\alpha=const} = 0, \tag{4}$$

which must be satisfied simultaneously. The resulting solution for $\alpha$ is readily seen to be:

$$\alpha = \frac{\int d\omega \text{Re}\left[\tilde{P}*(\omega)e^{i\phi(\omega)}|\tilde{N}(\omega)|\right]}{\int d\omega |\tilde{N}(\omega)|^2}, \tag{5}$$

while the equation defining $\phi(\omega)$ becomes:

$$0=\int d\omega Re[-ie^{i\phi(\omega)}\tilde{P}*(\omega)|\tilde{N}(\omega)|] \tag{6}$$

where * indicates complex conjugate. It will be noted that equation (6) must be satisfied for arbitrary input $\tilde{P}$, so the integrand must be zero for all $\omega$. Thus, Eq. (6) becomes:

$$\phi(\omega)=Arg[\tilde{P}(\omega)], \tag{7}$$

which become the assigned phases, as discussed above, while Eq. (5) becomes:

$$\alpha = \frac{\int d\omega |\tilde{P}(\omega)||\tilde{N}(\omega)|}{\int d\omega |\tilde{N}(\omega)|^2}, \tag{8}$$

Since $|\tilde{N}(\omega)|$ is assumed to be known and the recorded data P(t) is actually known, Eqs. (1), (7) and (8) give the filter output as:

$$\tilde{F}(\omega) = e^{+i\phi(\omega)}\left(|\tilde{P}(\omega)| - \frac{\int d\omega |\tilde{P}(\omega)||\tilde{N}(\omega)|}{\int d\omega |\tilde{N}(\omega)|^2}|\tilde{N}(\omega)|\right), \tag{9}$$

which is completely independent of the particular form of the signal $\tilde{S}(\omega)$.

An algebraic interpretation of the filter represented by Eq. (9) is that its amplitude $\tilde{F}(\omega)$ is the spectrum of the data with the noise spectrum projected out. Furthermore, the phase of $\tilde{F}(\omega)$ is identical to that of $\tilde{P}(\omega)$, leading to the description of the instant filter and filtering method as being "matched-phase." The geometric interpretation is that the output of the filter is orthogonal to an "optimal" realization of the noise achieved without a priori knowledge of either the signal or phases of the true noise field. By orthogonal, it is simply meant uncorrelated. Here, this means that the integral of $\tilde{F}(\omega)$ and $\tilde{N}(\omega)$ over all $\omega$ is zero. In fact, $\alpha$ is the correlation coefficient between the spectrum of the recorded data and spectrum of the noise, where in the limit $|\tilde{P}(\omega)| \rightarrow |\tilde{F}(\omega)|$, $\alpha$ approaches unity. Thus, after applying the MPN filter algorithm of Eq. 9, the time domain signal S(t) is generated by inverse FFT processing.

The effect of the MPN filtering method according to the first preferred embodiment of the present invention can best be seen by referring to FIG. 2 and the description immediately below. In FIG. 2, the upper curve, which is labeled "Noise", depicts a section of the frequency spectrum of a high amplitude computer generated noise time series. The lower portion of FIG. 2 includes two curves, a smooth curve atop a jagged curve. The smooth curve, which is labeled "Signal" and which is the signal of interest, shows the frequency spectrum of a door chime consisting of two bell tones (high-low) about ⅙ second apart. The door chime signal is added numerically to the noise time series. The sum of these two signals is input to the MPN filter.

With respect to FIG. 2, the SNR, which is integrated over the entire frequency band, is −100 dB. It will be appreciated with an SNR this low, one cannot even hear the door begin a playback of the noisy time series. In attempting to recover the signal, the MPN filter is provided with only the frequency spectrum of the noise, with the phase information having been discarded. The lower jagged curve bearing the label Filter Output is the frequency spectrum of the signal extracted from the noise. It will be immediately recognized that the signal is clearly discernable in the output, with output power being half signal and half residual noise.

It should be noted that if the estimate of the noise spectrum is perfectly accurate, the output power advantageously will be half signal and half noise. Rigid mathematical proof of this statement has been established in a paper entitled "Performance of The Matched-Phase Noise Filter With Estimated Noise Spectra" by E. McDonald et al., *Journal of Computational Physics* 122, 185–190 (1995), which paper is incorporated herein by reference for all purposes. The ideal performance of the MPN filter has been proven mathematically when the noise spectrum as a function of frequency is known exactly. In that case, the MPN filter improves an arbitrarily low SNR (−100 dB and −300 dB cases have been demonstrated with computer simulated data) to 0 dB. That is, the output power is half signal and half noise. In an alternative case where only an approximation of the shape of the noise spectrum is known, the error in the assumed noise spectral shape shows up as increased residual noise in the MPN filter output.

A second preferred embodiment according to the present invention will now be described while referring to FIG. 3, which is a high level block diagram of a MPN filter. It should be mentioned that although the elements are shown and described as if implemented using discrete components, the MPN filter advantageously can be embodied in software or in a digital signal processor. Moreover, while the MPN filter preferably receives noise spectra output from a lookup table (LUT), other noise spectra sources advantageously can be used. For example, rather than storing a large number of noise spectra in the lookup table, the MPN filter may obtain the noise spectra by sampling the received signal P(t) periodically and converting this signal into the frequency domain. It will be appreciated that since the assumption is that the signal S(t) may or may not be present, the periodically sampled signal P(t) advantageously can be used in developing a reliable estimate of the noise spectrum.

Figure 3:
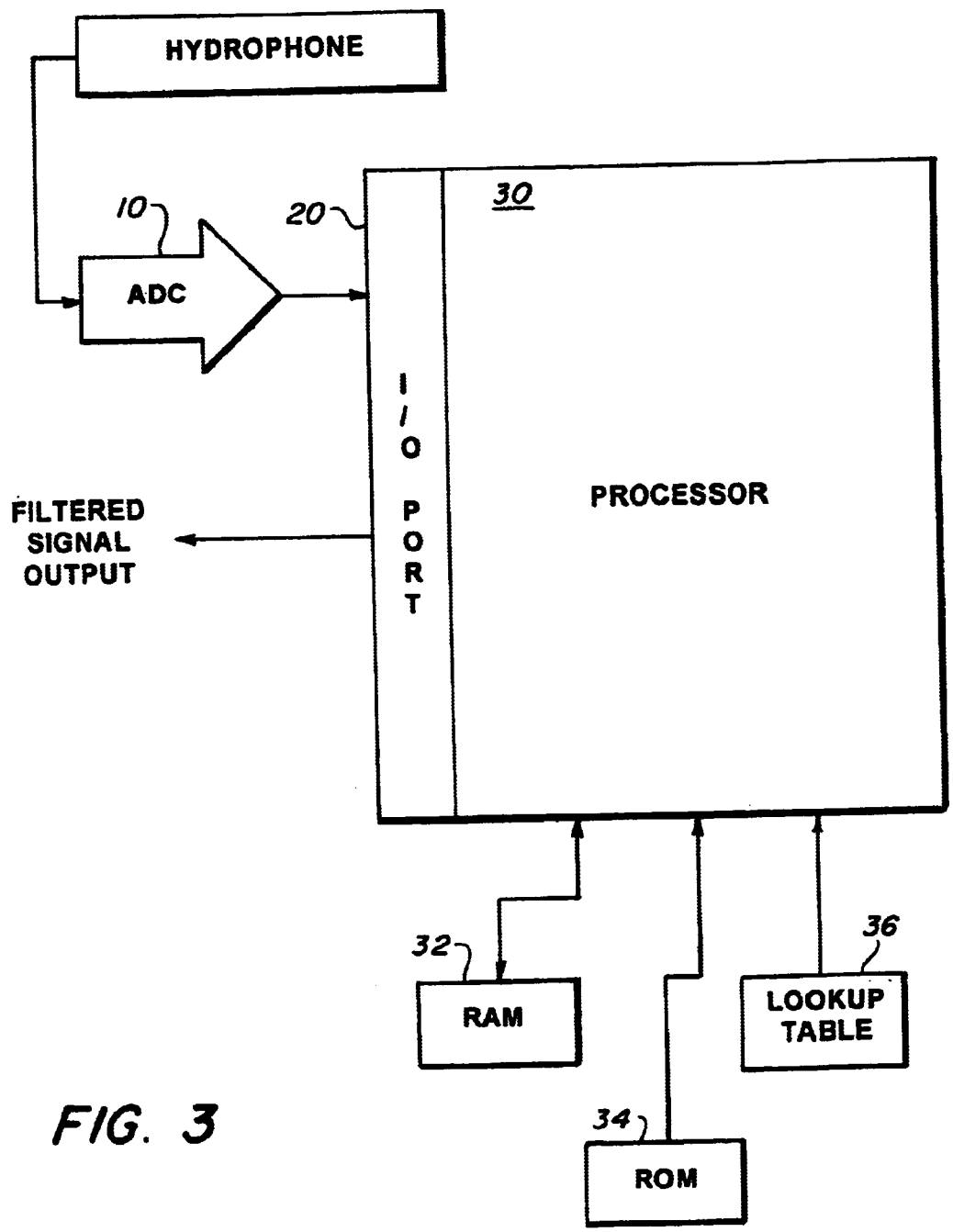
FIG. 3 is a high level block diagram of a matched phase noise (MPN) filter according to another preferred embodiment of the present invention.

Referring to FIG. 3, a MPN filter according to the second preferred embodiment of the present invention includes an analog-to-digital converter (ADC) 10 receiving an analog acoustic signal and generating a digital acoustic signal applied to a processor 30 via and input/output (I/O) port 20. Preferably, processor 30 is electrically connected to a random access memory (RAM) 32 acting as a scratchpad memory, a read only memory (ROM) 34 storing fixed data and instructions, and a lookup table (LUT) 36 storing various noise spectra. Processor 30 selects one of the noise spectra responsive to a selection signal, which preferably is indicative of noise spectra. Thus, the selection signal advantageously can be indicative of wind speed or sea state. In addition, processor 30 performs an inverse Fast Fourier Transform of the MPN filter output and outputs the results via I/O port 20 as a digital filtered signal.

As discussed above, the MPN filter and filtering method according to the present invention are advantageously adapted to maximize the intelligible signal within a noise-dominated signal recorded or received by a single acoustic pickup, e.g., a hydrophone. However, it should be clearly understood that the present invention is not limited to systems having a single input device. MPN filters according the present invention advantageously can be used as pre-processors for an acoustic array. Stated another way, a plurality of MPN filters can be serially connected between a plurality of hydrophones and the beamformer circuitry of the sonar system.

Moreover, it should be mentioned that the present invention can be used to enhance and filter signals of all type and is not limited to the acoustic embodiments discussed above. For example, the MPN filter advantageously can be used in law enforcement surveillance to overcome the problems of phase matching in the subtraction method previously addressed. Moreover, the MPN filter according to the present invention can be employed in recovering signals intentionally or unintentionally masked by white noise.

Preferably, the present invention can be adapted to improve and enhance the clarity of audio sources such as classic records. It should also be mentioned that the present invention is not limited to audio processing and enhancement. Other portions of the electromagnetic spectrum, i.e., visible light are also susceptible to MPN filtering.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A matched-phase noise filter comprising a processor implementing the filter function:

$$\tilde{F}(\omega) = e^{+1\phi(\omega)}\left(|\tilde{P}(\omega)| - \frac{\int d\omega |\tilde{P}(\omega)| \, |\tilde{N}(\omega)|}{\int d\omega |\tilde{N}(\omega)|^2} |\tilde{N}(\omega)|\right),$$

wherein:

$\phi(\omega)$ is a set of phases;

$\tilde{P}(\omega)$ is the frequency spectrum of a received signal;

$\tilde{N}(\omega)$ is the frequency spectrum of a noise component of the received signal; and $\tilde{F}(\omega)$ is the frequency spectrum of the received signal with the noise spectrum projected out.

2. A method for filtering a noise dominated signal, comprising the steps of:

producing an actual spectrum of the noise dominated signal responsive to said noise dominated signal;

selecting an estimated spectrum representing noise in the noise dominated signal;

generating a desired spectrum indicative of a signal of interest based on said actual spectrum and said estimated spectrum and independent of the particular form of said signal of interest.

3. The method for filtering a noise dominated signal as recited in claim 2, further comprising the step of converting said desired spectrum to an output signal wherein the output power of said output signal is approximately half said signal of interest and approximately half said noise.

4. The method for filtering a noise dominated signal as recited in claim 2, wherein said generating step comprises:
generating said desired spectrum indicative of said signal of interest based on said actual spectrum and said estimated spectrum and independent of the particular form of said signal of interest using the formula:

$$\tilde{F}(\omega) = e^{+1\phi(\omega)}\left(|\tilde{P}(\omega)| - \frac{\int d\omega |\tilde{P}(\omega)||\tilde{N}(\omega)|}{\int d\omega |\tilde{N}(\omega)|^2}|\tilde{N}(\omega)|\right),$$

wherein:
$i=(-1)^{1/2}$;
$\phi(\omega)$ is a set of phases;
$\tilde{P}(\omega)$ is the frequency spectrum of said actual spectrum;
$\tilde{N}(\omega)$ is the frequency spectrum of said estimated spectrum; and
$\tilde{F}(\omega)$ is the frequency spectrum of said desired spectrum with the estimated spectrum projected out.

5. The method for filtering a noise dominated signal as recited in claim 2, further comprising the step of selecting said estimated spectrum from a collection of estimated spectra indexed according to a measurable parameter.

6. The method for filtering a noise dominated signal as recited in claim 5, wherein said measurable parameter is wind speed.

7. The method for filtering a noise dominated signal as recited in claim 2, wherein said producing step comprises:
receiving the noise dominated signal in the time domain;
converting the noise dominated signal in the time domain to the frequency domain thereby producing the actual spectrum of the noise dominated signal responsive to the noise dominated signal.

8. A method for filtering a noise dominated signal, comprising the steps of:
receiving a time series signal consisting mostly of noise and containing a signal of interest;
selecting a close estimate of the frequency dependence of the noise spectrum within said time series signal;
executing a Fast Fourier transform (FFT) of the time series signal so as to obtain input spectral amplitudes and phases of each frequency component of said time series signal;
orthogonalizing said input spectral amplitudes to the noise spectral amplitude so as to produce orthogonalized spectral amplitudes;
assigning input phases to the resultant orthogonalized spectral amplitudes so as to produce assigned phases; and
inverse FFT transforming the assigned phases and said orthogonalized spectral amplitudes back into the time domain to thereby produce a matched-phase signal;
wherein a signal to noise ratio (SNR) of said signal of interest with respect to said noise in said matched-phase signal is at least an order of magnitude greater than the SNR of said time series signal.

9. The method for filtering a noise dominated signal as recited in claim 8, wherein the output power of said matched filter signal comprises approximately half said signal of interest and approximately half said noise.

10. A filter comprising:
an input portion effective to receive an input signal having a spectrum $\tilde{F}(\omega)$, where $\omega$ is frequency, said input signal having a component $\tilde{N}(\omega)$; and
a filtering portion, said filtering portion being effective to form a filtered signal $\tilde{F}(\omega)$ such that:

$$\tilde{F}(\omega)=\tilde{P}(\omega)-\alpha \exp[i\phi(\omega)|\tilde{N}(\omega)|]$$

where $i=(-1)^{1/2}$, $\phi(\omega)$ is phase as a function of said $\omega$, and $\alpha$ is a scalar term;
said filtering portion being further effective to select either $\alpha$ or $\phi(\omega)$ to cause selective attenuation of said $\tilde{N}(\omega)$ with respect to said $\tilde{P}(\omega)$ in said filtered signal $\tilde{F}(\omega)$.

11. The filter of claim 10, wherein said a is selected to be the correlation coefficient of said $\tilde{P}(\omega)$ and said $\tilde{N}(\omega)$.

12. The filter of claim 10, wherein said $\phi(\omega)=\text{Arg}[\tilde{P}(\omega)]$.

13. The filter of claim 10, wherein said $\alpha$ is:

$$\alpha = \frac{\int d\omega |\tilde{P}(\omega)||\tilde{N}(\omega)|}{\int d\omega |\tilde{N}(\omega)|^2}.$$

14. A matched-phase noise filter comprising a processor implementing a filter function, said filter function being proportional to:

$$e^{+i\phi(\omega)}\left(|\tilde{P}(\omega)| - \frac{\int d\omega |\tilde{P}(\omega)||\tilde{N}(\omega)|}{\int d\omega |\tilde{N}(\omega)|^2}|\tilde{N}(\omega)|\right),$$

wherein:
$\phi(\omega)$ is a set of phases;
$\tilde{P}(\omega)$ is the frequency spectrum of a received signal; and
$\tilde{N}(\omega)$ is the frequency spectrum of a noise component of the received signal.

* * * * *